(12) United States Patent
Gray et al.

(10) Patent No.: US 7,793,190 B1
(45) Date of Patent: *Sep. 7, 2010

(54) REDUCED CLASH GRA INTERLEAVERS

(75) Inventors: Paul Kingsley Gray, San Diego, CA (US); Keith Michael Chugg, La Canada, CA (US)

(73) Assignee: TrellisWare Technologies, Inc., San Diego, CA (US)

( * ) Notice: Subject to any disclaimer, the term of this patent is extended or adjusted under 35 U.S.C. 154(b) by 1007 days.

This patent is subject to a terminal disclaimer.

(21) Appl. No.: 11/463,857

(22) Filed: Aug. 10, 2006

Related U.S. Application Data (63) Continuation-in-part of application No. 11/404,499, filed on Apr. 14, 2006, now Pat. No. 7,584,400.

(60) Provisional application No. 60/707,447, filed on Aug. 10, 2005.

(51) Int. Cl.
*H03M 13/00* (2006.01)

(52) U.S. Cl. .................. 714/752; 714/755; 714/786

(58) Field of Classification Search .............. 714/752, 714/755, 786, 790, 762, 788
See application file for complete search history.

(56) References Cited

U.S. PATENT DOCUMENTS

| | | | |
|---|---|---|---|
| 6,392,572 B1 | 5/2002 | Shiu et al. | |
| 7,178,085 B2 * | 2/2007 | Chae et al. | 714/758 |
| 7,584,400 B2 | 9/2009 | Gray et al. | |
| 2004/0199859 A1 * | 10/2004 | Matsumoto | 714/801 |
| 2006/0036930 A1 | 2/2006 | Luby et al. | |
| 2006/0242530 A1 * | 10/2006 | Lu et al. | 714/752 |
| 2007/0143657 A1 | 6/2007 | Kanaoka et al. | |

FOREIGN PATENT DOCUMENTS

| | | |
|---|---|---|
| WO | WO 2004/040829 A | 5/2004 |
| WO | WO 2005/036758 A | 4/2005 |
| WO | WO 2005/096510 A | 10/2005 |

OTHER PUBLICATIONS

Chugg et al. "Flexible Coding for 802.11n MIMO Systems" Sep. 2004, www.trellisware.com/11-04-0593-04-000n-flexible-coding-802-11n-mimo-systems.pdf.

Giulietti et al. "Parallel turbo coding interleavers: avoiding collisions in accesses to storage elements", Electronics Letters, IEE Stevenage, GB, vol. 38, No. 5, Feb. 28, 2002 pp. 232-234.

Johnson et al."Interleaver and Accumulator Design for Systematic Repeat-Accumulate Codes", Communications Theory Workshop, 2005, Proceedings, 6th Australian Brisbane, Australia Feb. 2-4, 2005, Piscataway, NJ, IEEE, pp. 1-7.

(Continued)

*Primary Examiner*—Fritz Alphonse
(74) *Attorney, Agent, or Firm*—Townsend and Townsend and Crew LLP (57) ABSTRACT

Methods, apparatuses, and systems are presented for performing data encoding involving receiving a sequence of data bits, encoding the sequence of data bit according to a code characterized by a parity check matrix (H matrix) to generate a sequence of encoded bits, wherein the H matrix is capable of being expressed as $H=[Hp|Hd]=[S|J*P*T]$, S being a dual-diagonal matrix, J being a single parity check matrix, P being an interleaver permutation matrix, and T being a repeat block matrix, wherein the H matrix is a column permuted version of an original H matrix, wherein clashes associated with an interleaver corresponding to the P matrix are reduced by adopting the H matrix instead of the original H matrix, and outputting the sequence of encoded bits.

19 Claims, 7 Drawing Sheets

OTHER PUBLICATIONS

Mansour, "High-performance decoders for regular and irregular repeat-accumulate codes" Global Telecommunications Conference 2004, Globecom 2004, IEEE, Dallas Texas, Nov. 29, 2004-Dec. 3, 2004, pp. 2583-2588.

Ryan, "An Introduction to LDPC Codes," in CRC Handbook for Coding and Signal Processing for Recording Systems (B. Vasic, ed.) CRC Press retrieved from http://www.ece.arizona.edu/~ryan/New%20Folder/ryan-crc-ldpc-chap.pdf on Aug. 29, 2006.

Trellisware Technologies Inc. "Flexicodes: A Highly Flexible FEC Solution" Jul. 27, 2004 retrieved from the internet at http://web.archive.org/web2004072045022/trellisware.com/trellisware_flexicode_whitepaper.pdf retrieved on Jul. 28, 2006.

Trellisware Technologies Inc. "Forward error correction", Feb. 13, 2005, retrieved from the internet http://web.archive.org/web/20050213043231/http://trellisware.com/fec.htm retrieved on Jul. 28, 2006.

Yang et al. "Design of Efficiently Encodable Moderate-Length High-Rate Irregular LDPC Codes" IEEE Transactions on Communications, vol. 52, No. 4.

Yanping et al, "New Implementation for the scalable LDPC-decoders", Vehicular Technology Conference, 2004 VTC 2004-Spring. 2004 IEEE 59th Milan Italy May 17-19, 2004, Piscataway, NJ USA IEEE vol. 1.

U.S. Appl. No. 11/404,499, Office Action dated Jan. 22, 2009, 11 pages.

U.S. Appl. No. 11/404,499, Notice of Allowance dated Apr. 29, 2009, 4 pages.

* cited by examiner

FIG. 3A $$H = [H_p | H_d] = \begin{bmatrix} 1 & 0 & 0 & \cdots & 0 & h_1^t \\ 1 & 1 & 0 & \cdots & 0 & h_2^t \\ 0 & 1 & 1 & \cdots & 0 & h_3^t \\ 0 & 0 & 1 & \ddots & 0 & h_4^t \\ \vdots & & & \ddots & 0 & \vdots \\ 0 & 0 & 0 & 1 & 1 & h_{n-k}^t \end{bmatrix}$$

S: dual-diagonal accumulator block (N-K x N-K)
D: lower-diagonal block (N-K x N-K)
T: repeat block (QK x K)
P: permutation of interleaver (QK x QK)
J: SPC mapping (N-K x QK )

Low Density Parity Check: $\mathbf{Hc} = \mathbf{0}$

FIG. 4

$$S = \begin{bmatrix} 1\,0\,0\,\ldots\,0\,0\,0 \\ 1\,1\,0\,0\,\ldots\,0\,0\,0 \\ 0\,1\,1\,0\,0\,\ldots\,0\,0 \\ 0\,0\,1\,1\,0\,0\,\ldots\,0 \\ 0\,0\,0\,1\,1\,0\,\ldots\,0 \\ \\ 0\,0\,\ldots\,0\,0\,1\,1\,0 \\ 0\,0\,0\,\ldots\,0\,0\,1\,1 \end{bmatrix}$$
(N-K x N-K)

$$D = \begin{bmatrix} 1\,0\,0\,\ldots\,0\,0\,0 \\ 1\,1\,0\,0\,\ldots\,0\,0\,0 \\ 1\,1\,1\,0\,0\,\ldots\,0\,0 \\ 1\,1\,1\,1\,0\,0\,\ldots\,0 \\ 1\,1\,1\,1\,1\,0\,\ldots\,0 \\ \\ 1\,1\,\ldots\,1\,1\,1\,1\,0 \\ 1\,1\,1\,\ldots\,1\,1\,1\,1 \end{bmatrix}$$
(N-K x N-K)

$$P = \begin{bmatrix} 0\,0\,0\,0\,\ldots\,1\,0\,0 \\ 0\,0\,0\,1\,\ldots\,0\,0\,0 \\ 1\,0\,0\,0\,0\,\ldots\,0\,0 \\ \\ 0\,0\,\ldots\,1\,0\,0\,0\,0 \\ 0\,1\,0\,\ldots\,0\,0\,0\,0 \end{bmatrix}$$
(pseudo-random permutation matrix)
(QK x QK)

$$T = \begin{bmatrix} \boxed{1}\,0\,0\,\ldots\,0\,0\,0 \\ 1\,0\,0\,0\,\ldots\,0\,0\,0 \\ \vdots \\ \boxed{1}\,0\,0\,0\,0\,0\,\ldots\,0 \\ 0\,\boxed{1}\,0\,0\,0\,0\,\ldots\,0 \\ 0\,1\,0\,0\,0\,0\,\ldots\,0 \\ \vdots \\ 0\,\boxed{1}\,0\,0\,0\,0\,\ldots\,0 \\ \vdots \\ 0\,0\,\ldots\,0\,0\,0\,0\,\boxed{1} \\ 0\,0\,\ldots\,0\,0\,0\,0\,1 \\ \vdots \\ 0\,0\,\ldots\,0\,0\,0\,0\,\boxed{1} \end{bmatrix} \begin{matrix} \Big\} Q_1 \\ \\ \Big\} Q_2 \\ \\ \Big\} Q_k \end{matrix}$$
(QK x K)

$$J = \begin{bmatrix} \boxed{1\,1\,\ldots\,1} & & & & & \mathbf{0} \\ & \boxed{1\,1\,\ldots\,1} & & & & \\ & & \boxed{1\,1\,\ldots\,1} & & & \\ & & & \boxed{1\,1\,\ldots\,1} & & \\ \mathbf{0} & & & & \ddots & \\ & & & & & \boxed{1\,1\,\ldots\,1} \end{bmatrix}$$
(N-K x QK)

$$H = \begin{bmatrix} S & JPT \end{bmatrix}$$

FIG. 5

- M consecutive values in the input frame are generated in parallel
- Each of these is written to different memory sub-banks
- M consecutive values in the output frame are accessed in parallel
- Each of these must be read from different memory sub-banks
- For each $j_1$ and $j_2$ from the same group of M values in the output frame $\pi(j_1)\%M \neq \pi(j_2)\%M$

FIG. 6

- M values in the input frame spaced QK/M apart are generated in parallel
- Each of these is written to different memory sub-banks
- M values in the output frame spaced QK/M apart are accessed in parallel
- Each of these must be read from different memory sub-banks
- For each $j_1$ and $j_2$ separated by QK/M in the output frame $\lfloor \pi(j_1)/(QK/M) \rfloor \neq \lfloor \pi(j_2)/(QK/M) \rfloor$

FIG. 7

REDUCED CLASH GRA INTERLEAVERS

CROSS-REFERENCES TO RELATED APPLICATIONS

This application claims the benefit of and is a non-provisional of U.S. Patent Application Ser. No. 60/707,447 filed on Aug. 10, 2005, and is also a Continuation-In-Part of U.S. patent application Ser. No. 11/404,499 filed on Apr. 14, 2006, now U.S. Pat. No. 7,584,400 which are hereby expressly incorporated by reference in their entirety for all purposes.

BACKGROUND OF THE INVENTION

The transmission of data through a noisy channel could introduce errors into the data stream. In order to reduce the amount of errors in the data sequence reconstructed after transmission through the channel, coding techniques have been developed that provide the ability to correct such errors. This is achieved usually through the addition of redundant information as part of the transmission. Here the term transmission is used broadly to include transfer of data through different types of medium. This can include communication mediums such as those used in wired, wireless, satellite, and other technologies. This can also include storage mediums such as magnetic, semiconductor, and other types of memory.

Forward error correction (FEC) allows data to be transmitted through such noisy channels by correcting providing error correction capability. Generally speaking, FEC involves encoding the source data into encoded data at the transmitter. The transmitter sends the encoded data through the noisy channel which introduces errors. At the receiver, the data received from the channel is decoded to remove errors to the extent the FEC is capable, producing a reconstructed version of the original source signal. The type of FEC coding used can greatly affect the error correction performance of the system.

Some of the most popular and powerful FEC coding techniques known today include generalized-repeat-accumulate (GRA) codes and low density parity check codes (LDPC). As is known in the art, GRA codes are characterized by the encoding steps of repeating the source data, performing an interleaving or re-ordering function, and performing an accumulation function. Also, as is known in the art, LDPC codes are characterized by a parity check matrix, often referred to as an H-matrix, which defines the encoding performed on the source signal.

GRA codes and LDPC codes have their individual advantages. Up until recently, an implementation of an FEC communication system needing to utilize the power of either GRA or LDPC codes has had to make a decision to either build the entire system around either an GRA code or an LDPC code. Such rigidity means that the specification of an FEC code design would dictate the type of code used, instead of allowing the system designer to choose the optimal types of encoding and decoding structures in either the GRA or LDPC format, based on attributes that are most important to the system. As discussed in more detail below, the GRA structure can be used to decode the LDPC encoded data using a turbo-like decoder architecture. However, if the equivalent interleaver in the GRA code leads to "clashes," then the throughput of high-speed, parallel turbo-like decoders will suffer. Thus, there is a significant need for techniques that modify existing LDPC codes so that the number of clashes in the equivalent interleaver can be reduced while effectively maintaining performance.

BRIEF SUMMARY OF THE INVENTION

The present invention relates to methods, apparatuses, and systems for performing data encoding involving receiving a sequence of data bits, encoding the sequence of data bit according to a code characterized by a parity check matrix (H matrix) to generate a sequence of encoded bits, wherein the H matrix is capable of being expressed as H=[Hp|Hd]= [S|J*P*T], S being a dual-diagonal matrix, J being a single parity check matrix, P being an interleaver permutation matrix, and T being a repeat block matrix, wherein the H matrix is a column permuted version of an original H matrix, wherein clashes associated with an interleaver corresponding to the P matrix are reduced by adopting the H matrix instead of the original H matrix, and outputting the sequence of encoded bits.

The encoding step may be performed using a generalized-repeat-accumulate (GRA) encoder comprising a repetition encoder, an interleaver, a single parity check encoder (SPC), and an accumulator. The encoding step may be performed using a generalized-repeat-accumulate (GRA) encoder comprising a repetition encoder, an interleaver, an accumulator, and a bit puncture unit. The encoding step may be performed using a low density parity check (LDPC) encoder.

The original H matrix may be capable of being generated from an original base matrix, the original base matrix comprising a plurality of entries, each entry defining a sub-matrix for the original H matrix, wherein the H matrix is capable of being generated from a base matrix comprising a plurality of entries, each entry defining a sub-matrix for the H matrix, and wherein the base matrix is a column permuted version of the original base matrix.

The H matrix may be capable of being generated from a base matrix comprising a plurality of entries, each entry defining a sub-matrix for the H matrix, and a vertical stack of sub-matrices defined by a column of entries in the base matrix may be cyclically column shifted to generate a corresponding vertical stack of sub-matrices within the H matrix.

The original H matrix may be capable of being generated from an original base matrix, the original base matrix comprising a plurality of entries, each entry defining a sub-matrix for the original H matrix, wherein the H matrix is capable of being generated from a base matrix comprising a plurality of entries, each entry defining a sub-matrix for the H matrix, wherein the base matrix is a column permuted version of the original base matrix, and wherein a vertical stack of sub-matrices defined by a column of entries in the base matrix is cyclically column shifted to generate a corresponding vertical stack of sub-matrices within the H matrix.

The P matrix may be a column permuted version of an original P matrix, the original P matrix also conforming to H=[Hp|Hd]=[S|J*P*T]. Furthermore, the P matrix may be a row permuted version of an original P matrix, the original P matrix also conforming to H=[Hp|Hd]=[S|J*P*T].

DETAILED DESCRIPTION OF THE INVENTION

System Description

Figure 1:
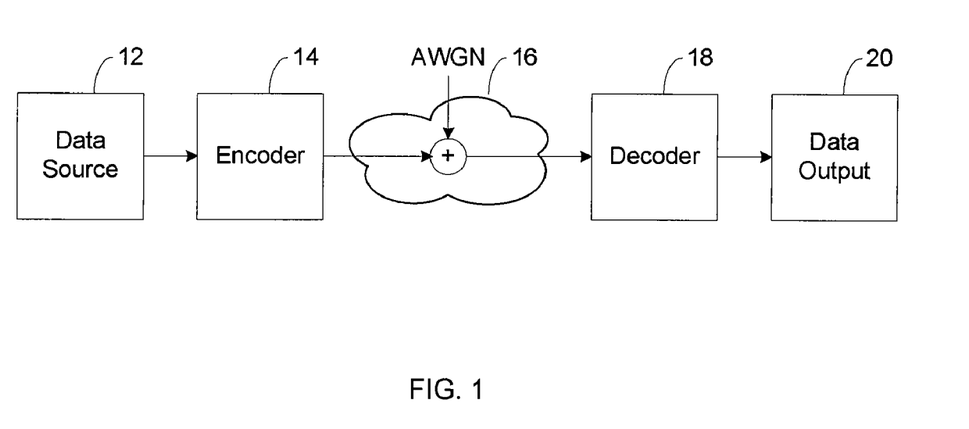
FIG. 1 shows a digital communication system according to an embodiment of the present invention.

FIG. 1 shows a digital communication system 10 according to an embodiment of the present invention. Digital communication system 10 includes a data source 12 providing symbols defined on a closed set of symbols. For example, if a binary closed set of symbols is used, the symbols are selected from {0, 1}. Data source 12 may be the originator of the symbols. Alternatively, data source 12 may be an input interface that receives the symbols from another source. The symbols from the data source 12 are forwarded to encoder 14, which converts the symbols into encoded symbols according to the structure of encoder 14. The encoded symbols are then sent through a channel 16, which can add noise, such as additive white Gaussian noise (AWGN), and distortions to the encoded symbol to produce a received signal. Soft information relating to the received signal is sent to a decoder 18. Decoder 18 outputs soft information regarding the symbols which can be thresholded to produce hard-decision decoded symbols. The decoded symbols are forwarded to a data output 20. Data output 20 may be a final destination for the decoded symbols. Alternatively, data output 20 may be an output interface that outputs the decoded symbols to another destination.

The digital communication system shown in FIG. 1 is a functional block diagram providing an illustrative example of basic functions. Different functions may be added or omitted. Also, application of the innovative methods discussed herein is not limited to this specific block diagram. Similarly, other block diagrams discussed below are merely illustrative examples and do not limit the applicability of the methods discussed herein.

GRA Encoder

Figure 2A:
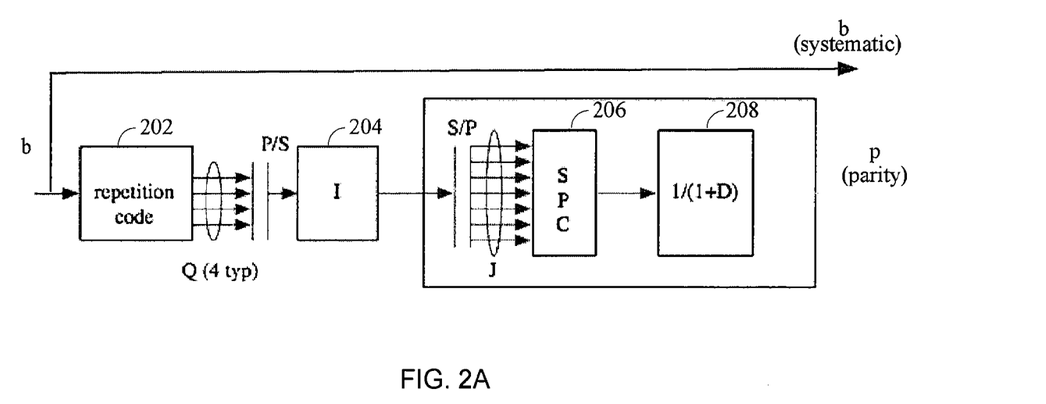
FIG. 2A is a block diagram of an encoder implemented as an generalized-repeat-accumulate (GRA) encoder according to an embodiment of the invention.

FIG. 2A is a block diagram of encoder 14 implemented as an generalized-repeat-accumulate (GRA) encoder according to an embodiment of the invention. GRA encoder 14 comprises a repetition code block 202, an interleaver 204, a single parity check block 206, and an accumulator 208. Here and in later sections, all symbols are described as being binary symbols, or bits. This includes source symbols, encoded, symbols, and decoded symbols. However, it should be understood that the invention is not necessarily limited to binary symbols. The rate of this GRA code is K/N. That is, for every K source bits, N encoded bits are generated.

GRA encoder 14 represents a systematic code. This means that the encoded bits comprise two parts, systematic bits and parity bits. The systematic bits are identical to the source bits. The parity bits are generated based on the source bits. Here, the systematic bits (which are the source bits) are referred to as "b." The parity bits are referred to as "p."

As shown in the figure, generation of the systematic bits "b" by GRA encoder 14 is trivial. The source bits are simply forwarded to produce the systematic bits. Generation of the parity bits "p" by GRA encoder 14 is described below.

First, the source bits are provided to repetition code block 202. Repetition code block 202 generates an output that is formed by repeating each source bit a number of times ("Q"). The number of times each source bit is repeated, Q, can vary. Q may be selected from amongst a plurality of predetermined values. Even though Q varies, it may attain an average value over time. In the embodiment shown in this figure, the average value of Q is 4. According to a different embodiment of the invention, Q is fixed a particular value and does not change.

According to an embodiment of the invention, the output of repetition code block 202 is provided to interleaver 204. Here, the output of repetition block 202 is generated in parallel format, converted to serial format, then provided to interleaver 204. Specifically, every group of Q parallel bits is converted into Q serial bits. Interleaver 204 interleaves, or re-orders the data according to a known pattern.

The output of interleaver 204 is provided to single parity check block 206. Here, the output of interleaver 206 is generated in serial format, converted to parallel format, then provided to single parity check block 206. Specifically, every group of J serial bits is converted into J parallel bits. Single parity check block 206 performs a single parity check on each set of J bits. This can be implemented by performing an XOR operation on the J bits. According to one embodiment of the invention, J is a fixed number. According to another embodiment of the invention, J is time-varying.

Finally, the output of single parity check block 206 is provided to accumulator 208. Accumulator 208 performs a 1-bit accumulation function. This can be implemented by performing an XOR operation on each current bit and the previous result. The output bits from accumulator 208 is generated as the parity bits "p."

Although not shown in FIG. 2A, the combination of parity check block 206 followed by accumulator 208 can be replaced by an accumulator followed by a 1-of-J bit puncture circuit, according to another embodiment of the invention.

Figure 2B:
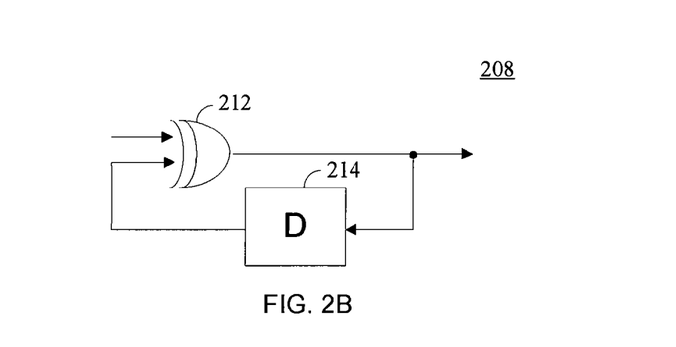
FIG. 2B shows an implementation of an accumulator of an GRA encoder according to an embodiment of the invention.

FIG. 2B shows an implementation of accumulator 208 according to an embodiment of the invention. Here, accumulator 208 comprises an XOR gate 212 and a D flip-flop 214. The bit arriving at accumulator 208 is provided to the first input to XOR gate 212. The previous output of accumulator 208 is stored in D flip-flop 214 and is provided to the second input of XOR gate 212. The output of XOR gate 212 is provided as the current output of the accumulator. The output of XOR gate 212 is also stored into D flip-flop in preparation for performing the next iteration when the next bit arrives at accumulator 208.

Figure 2C:
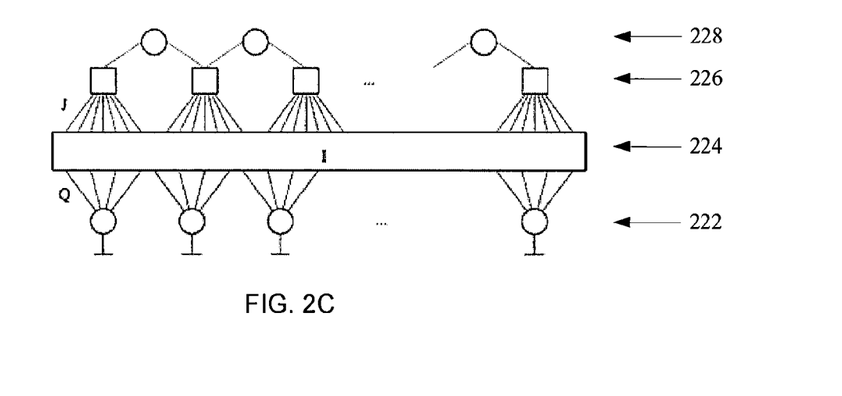
FIG. 2C presents a graphical model of an GRA encoder.

FIG. 2C presents a graphical model of GRA encoder 14. The graphical model comprises a repetition stage 222, an interleaver stage 224, a single parity check stage 226, and an accumulator stage 228. The source bits are first processed by repetition stage 222. Here, repetition stage 222 repeats each source bit Q times. Next, the repeated bits are processed by interleaver stage 224, which performs an interleaving or re-ordering function. The interleaved bits are processed, in groups of J bits, by single parity check stage 226. The parity check bits are then processed by accumulator stage 228. The output of accumulator state 228 is the parity bits "p." Again, the source bits are simply forwarded to generate the systematic bits "b."

LDPC Encoder

Figure 3A:
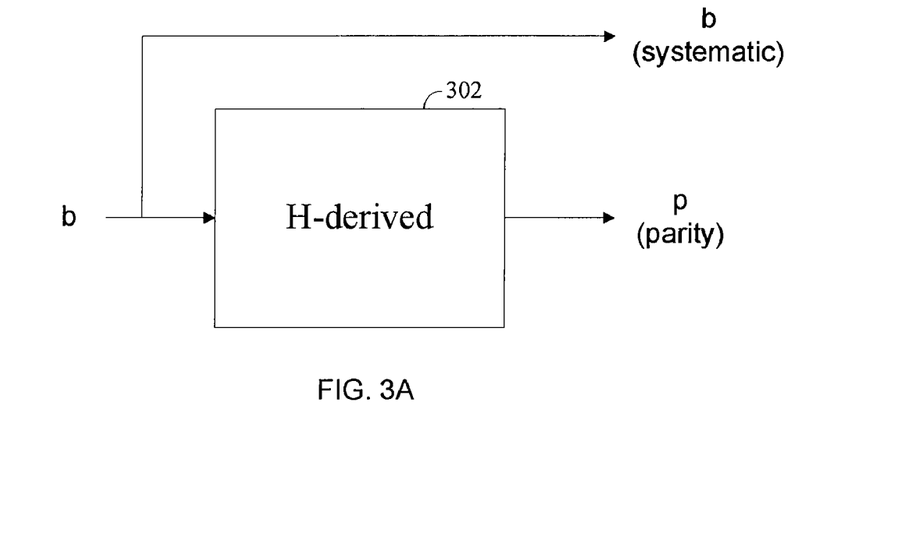
FIG. 3A is a block diagram of an encoder implemented as a low density parity check (LDPC) encoder according to an embodiment of the invention.

FIG. 3A is a block diagram of encoder 14 implemented as a low density parity check (LDPC) encoder according to an embodiment of the invention. The rate of this LDPC code is K/N. That is, for every K source bits, N encoded bits are generated.

LDPC encoder 14 represents a systematic code. Again, this means that the encoded bits comprise two parts, systematic bits and parity bits. The systematic bits are identical to the source bits. The parity bits are generated based on the source bits. Here, the systematic bits (which are the source bits) are referred to as "b." The parity bits are referred to as "p."

As shown in the figure, generation of the systematic bits "b" by LDPC encoder 14 is trivial. The source bits are simply forwarded to produce the systematic bits. Generation of the parity bits "p" by LDPC encoder 14 is performed using a block 302, which is described in further detail below. The operation of block 302 is defined according to a parity check matrix H. In fact, as is known in the art, the parity check matrix H completely defines the operation of LCPC encoder 14.

Figure 3B:
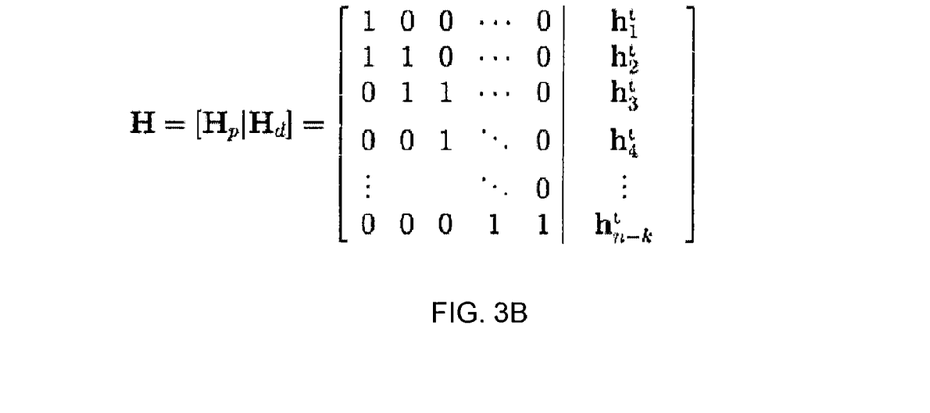
FIG. 3B illustrates the structure of a parity check matrix H, according to an embodiment of the present invention.

FIG. 3B illustrates the structure of a parity check matrix H, according to an embodiment of the present invention. Here, parity check matrix H is shown as being capable of being partitioned into two matrices, $H_p$ and $H_d$.

The first matrix $H_p$ is a "dual diagonal" matrix. Here, a dual diagonal matrix may be a matrix comprising two diagonals of "1"s. The first diagonal of "1"s extends from the upper left corner to the lower right corner of matrix $H_d$. The second diagonal of "1"s is positions directly below the first diagonal of "1"s.

The second matrix $H_d$ is a matrix comprised of a plurality of vertically stacked sub-matrices $h_1^t, h_2^t, h_3^t, h_4^t, \ldots, h_{N-K}^t$. Here, each sub-matrix h' is expressed in transposed form, as indicated by the "t" superscript. $H_d$ is sometimes also referred to as a random matrix. $H_d$ may have an average row weight J and an average column weight Q.

Figure 3C:
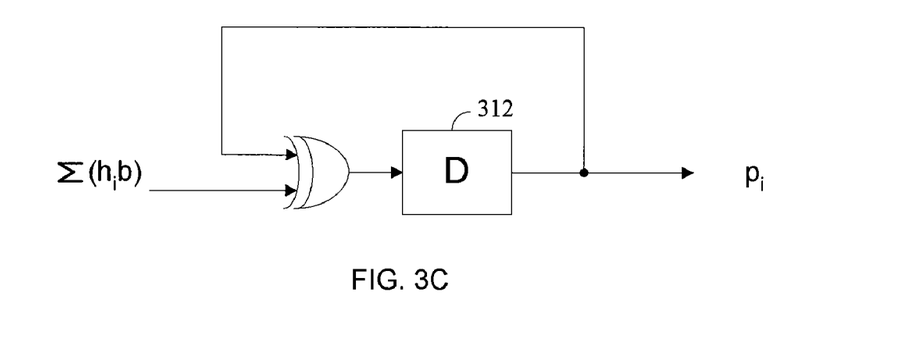
FIG. 3C shows a circuit that can be used in the implementation of a block within the LDPC encoder of FIG. 3A.

FIG. 3C shows a circuit that can be used in the implementation of block 302 in FIG. 3A. As mentioned previously, the calculation of parity bits "p" is based on the parity check matrix H. This is premised on the well known relationship that exists between the parity check matrix H and the encoded bits "c," which is expressed as:

$$H*c=0$$

Using this relationship and the following two identities:

$$H = [Hp \mid Hd] = \begin{bmatrix} 1 & 0 & 0 & 0 & \cdots & 0 & h_1^t \\ 1 & 1 & 0 & 0 & \cdots & 0 & h_2^t \\ 0 & 1 & 1 & 0 & & 0 & h_3^t \\ 0 & 0 & 1 & 1 & & 0 & h_4^t \\ \vdots & \vdots & & \ddots & \ddots & 0 & \vdots \\ 0 & 0 & 0 & 0 & & 1 & 1 & h_{N-K}^t \end{bmatrix}$$

$$c = \begin{bmatrix} p \\ b \end{bmatrix},$$

A set of simultaneous equations can be solved for the parity bits "p," such that they are expressed in terms of the source bits "b." In fact, given the dual diagonal structure of $H_p$, the parity bits can be easily obtained. A first parity bit $p_1$ can be found initially. Thereafter, each subsequent parity bit $p_i$ can be found based on the prior parity bit $p_{i-1}$. This is expressed in the two summation equations:

$$p_1 = \sum_j h_{1j} b_j$$

$$p_i = p_{i-1} + \sum_j h_{1ij} b_j$$

Such calculations can be implemented by utilizing the simple structure shown in FIG. 3C. D flip-flop 312 stores the prior parity bit $p_i$ as is generated. The calculation of the subsequent parity bit $p_i$ is based on an XOR operation performed on the prior parity bit $p_{i-1}$ and the summation involving the appropriate sub-matrix h and the source bits "b."

GRA-LDPC Equivalence

Figure 4:
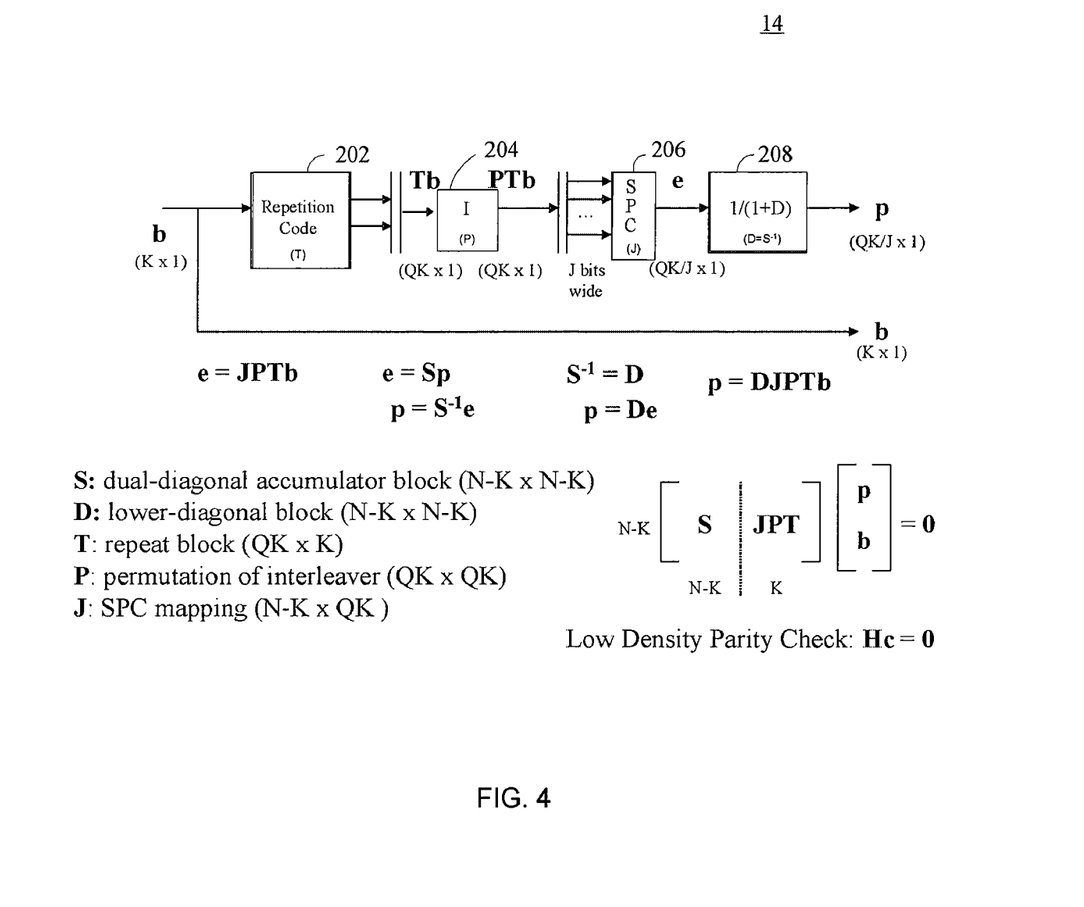
FIG. 4 illustrates an equivalence that can be found between an GRA encoder and an LDPC encoder, according to an embodiment of the invention.

FIG. 4 illustrates an equivalence that can be found between an GRA encoder and an LDPC encoder, according to an embodiment of the invention. Here, the various components of the GRA encoder shown in FIG. 2A is presented again. Each component is represented using a matrix. Thus, repetition code block 202 is represented by matrix T. Interleaver 204 is represented by matrix P. Single parity check block 206 is represented by matrix J. Accumulator 208 is represented by matrix D, which is also expressed as the matrix $S^{-1}$. The dimensions of these various matrices are shown in the figure.

Specifically, S is the dual-diagonal accumulator matrix of size (N−K×N−K). D is the lower-diagonal matrix of size (N−K×N−K). T is the repeat matrix of size (QK×K). P is the interleaver permutation matrix of size (QK×QK). Finally, J is the single parity check mapping matrix of size (N−K×QK), which can be implanted by XORing J input bits to produce each output bit.

The data at each stage of the GRA encoder is also represented using a matrix (more precisely, a vector). The source bits is represented by the vector b. The output of repetition code block 202 is thus represented by the vector Tb. The output of interleaver 204 is thus represented by the vector PTb. The output of single parity check block 206 is thus represented by the vector JPTb, which is also expressed as the vector e. Finally, the output of accumulator 208 is thus represented as the vector DJPTb, which is also expressed as the vector p. The dimensions of these various vectors are shown in the figure.

According to an embodiment of the invention, the GRA encoder shown here can be expressed as an equivalent LDPC encoder as follows. The matrix [S|JPT] can be equated to the parity check matrix H, expressed as H=[$H_p$|$H_d$]=[S|JPT]. It is known that the parity bits p and source bits b can be vertically stacked to form the code bits c, expressed as $$c = \begin{bmatrix} p \\ b \end{bmatrix}.$$

Given this, the matrices of the GRA encoder can be put into the form:

$$[S \mid JPT] * \begin{bmatrix} p \\ b \end{bmatrix} = 0,$$

which corresponds directly to the known form of the parity check matrix of the LDPC encoder:

$[H_p \mid H_d] * c = 0$ $H * c = 0$

An GRA code can be converted to an equivalent LDPC code as follows, according to an embodiment of the invention. Here, the $H_d$ portion of H is just S. The $H_p$ portion of H is JPT. P is completely defined by the interleaver permutation. J is completely defined by the single parity check width J. T is completely defined by the repetition code repeat values $Q_1$, $Q_2$, ..., $Q_k$.

J and T define the row and column combinations. JP can be formed by taking J rows at a time from P and adding them by modulo-2 addition. JPT can be formed by taking Q, columns at a time from JP and adding them by modulo-2 addition. If P is properly designed, $H_d$ would have row weight J and column weight $Q_i$.

An LDPC code can be converted to an GRA code as follows, according to an embodiment of the invention. If H is in the dual diagonal form $[H_p \mid H_d]$, then JPT is just $H_d$. P can be determined by "reversing" the row and column operations of J and T. Specifically, each weight-J row of JPT can be separated into J weight-1 rows, to form PT. Also, each weight-$Q_i$ column of PT can be separated into $Q_k$ weight-1 columns to form P. It should be noted that P is not unique. That is, the order of the J weight-1 rows and $Q_k$ weight-1 columns can be changed.

Figure 5:
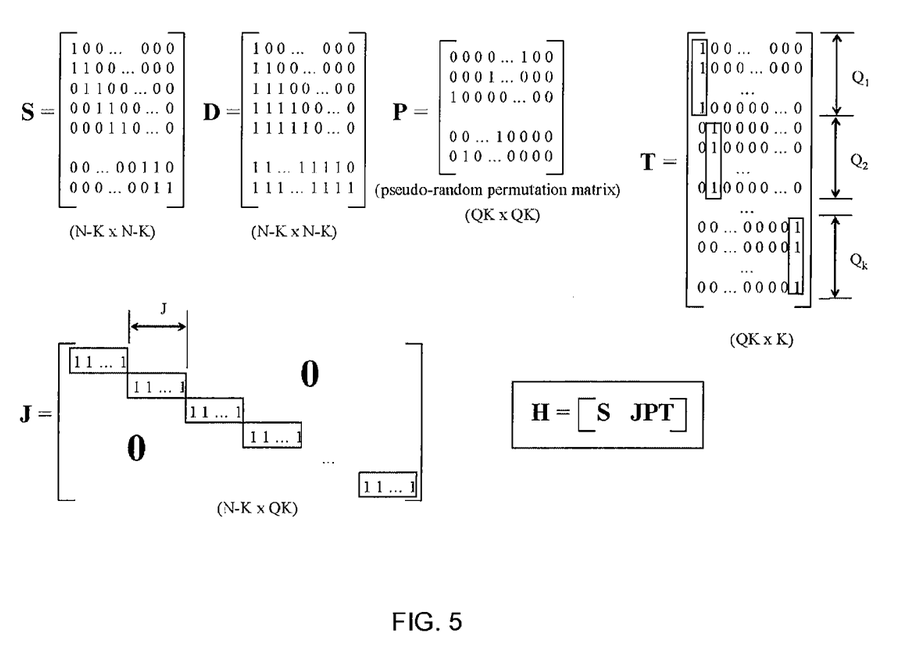
FIG. 5 presents matrices of an GRA code shown with illustrative values.

FIG. 5 presents matrices of the GRA code shown with illustrative values. As shown in the figure, S is a dual diagonal matrix. D is a lower diagonal matrix. P is an interleaver permutation matrix that shows how bits are to be permuted. Here, a pseudo-random permutation pattern is shown. T is a repeat matrix of that repeats each source bit Q times. Here, Q is a value that may be different for each source bit. J is the single parity check mapping matrix, which is shown as having a stair structure.

GRA interleaver Clash-Free Constraint

Figure 6:
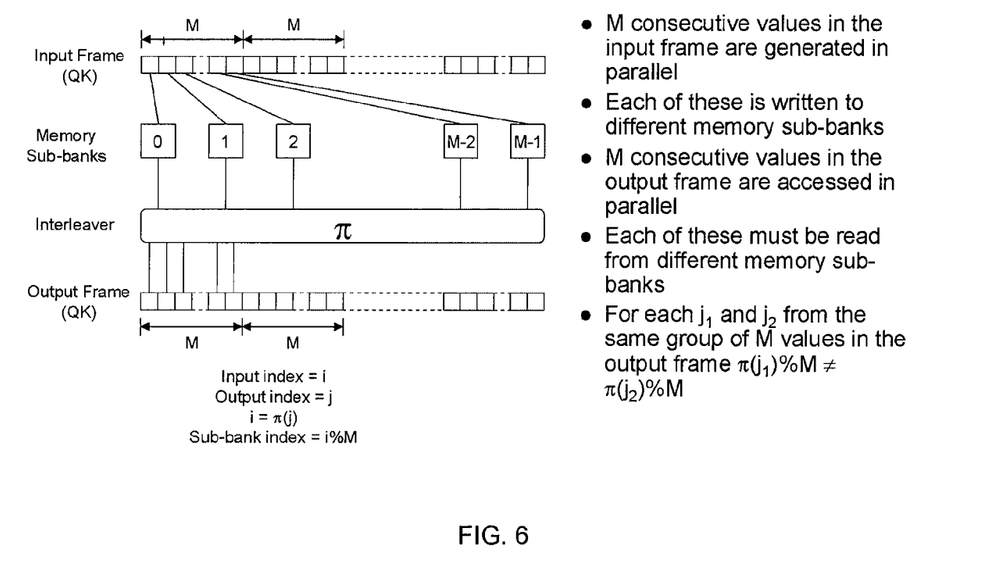
FIG. 6 illustrates a window decoder clash-free constraint, according to an embodiment of the invention.
Figure 7:
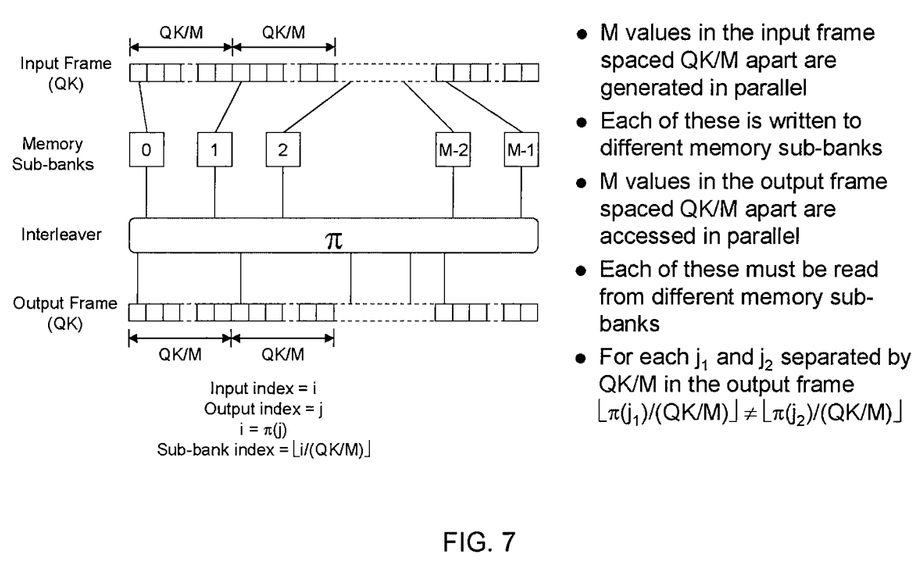
FIG. 7 illustrates a tile decoder clash-free constraint, according to one embodiment of the invention.

FIGS. 6 and 7 illustrates two different types of interleaver clash-free constraints. The general operation of an interleaver in this context is briefly discussed below. A sequence of bits inputted into an interleaver is organized into frames, referred to as input frames. An example of such an interleaver is interleaver 204 shown in FIG. 2A. For each input frame, the interleaver produces a corresponding output frame. The corresponding output frame contains the same bits found in the input frame, but rearranged in a different order. Each input frame is of length QK, that is, Q times K. Thus, each output frame is also of size QK. The same interleaving function $i = \pi(j)$ is performed on each input frame to produce a corresponding output frame.

As shown in the figure, the input index "i" identifies the location of a bit within an input frame. An output index "j" identifies the location of a bit within the corresponding output frame. The function $i = \pi(j)$ precisely defines the rearrangement, or interleaving used to transform the input frame into an output frame.

As a very simple example, for a frame size of QK=8, index i ranges from [0, 1, ..., 7], and index j ranges from [0, 1, ..., 7]. If an interleaving function $i = \pi(j)$ is defined as $0 = \pi(0)$, $1 = \pi(1)$, $2 = \pi(2)$, $3 = \pi(3)$, $7 = \pi(4)$, $6 = \pi(5)$, $5 = \pi(6)$, and $4 = \pi(7)$, then an input frame and a corresponding output frame would be produced as follows.

input frame=[a, b, c, d, e, f, g, h]

output frame=[a, b, c, d, h, g, f, e]

A frame size of QK=8 is used in this very simple example. Larger frame sizes may be implemented in an actual system.

High speed interleaving is performed by storing the bits of the input frame into memory that comprises M sub-banks. The output frame is then generated by reading from the memory, M bits at a time. Specifically, in each cycle, M bits of the output frame can be read out of the memory simultaneously, one from each sub-bank. The ability to generate the output frame M bits at a time essentially increases the speed of the interleaving process by a factor of M. The sub-banks of memory can be implemented in different ways.

FIG. 6 illustrates a window decoder clash-free constraint, according to an embodiment of the invention. This is a constraint on the interleaving function $i = \pi(j)$, which is represented by the interleaver permutation matrix P (of size QK×QK). Here, each input frame is divided into groups of size M. The M bits of the first group are generated in parallel and distributed to the M memory sub-banks labeled "0" through "M−1," such that each bit is stored to a separate sub-bank. The M bits of the second group can be generated and distributed to the M memory sub-banks in a similar manner. This is repeated for the third group, the fourth group, and so on. In this manner, the entire input frame is distributed to the M memory sub-banks.

Here, M consecutive values of the output frame are accessed in parallel. Specifically, a "π" block shown in the figure accesses the M memory sub-banks. The block performs the function $i = \pi(j)$ by employing M individual processes that separately access the M memory sub-banks in a parallel manner, such as in one clock cycle. This requires that the M consecutive values in the output frame be located in different ones of the M memory sub-banks. This requirement is referred to here as the window decoder clash-free constraint.

In other words, the window decoder clash-free constraint requires that for each $j_1$ and $j_2$ from the same group of M consecutive values in the output frame, the memory sub-bank containing $\pi(j_1)$ not equal the memory sub-bank containing $\pi(j_2)$. The index of the memory sub-bank can be expressed as i modulo M, or i % M. Thus, for each $j_1$ and $j_2$ from the same group of M values in the output frame, the window decoder clash-free constraint can also be expressed as:

$\pi(j_1) \% M \neq \pi(j_2) \% M$

FIG. 7 illustrates a tile decoder clash-free constraint, according to one embodiment of the invention. Again, this is a constraint on the interleaving function $i = \pi(j)$, which is represented by the interleaver permutation matrix P (of size QK×QK). Here, each input frame is divided into groups of size QK/M. A first batch of M bits spaced QK/M apart from one another within the input frame are generated in parallel. This first batch of M bits are distributed to the M memory sub-banks labeled "0" through "M−1," such that each bit is stored to a separate sub-bank. A second batch of M bits spaced QK/M apart from one another within the input frame are then generated in parallel. The position of this second batch of M bits within the input frame may be offset by 1 compared to the position of the first batch of M bits within the input frame. The second batch of M bits are distributed to the M memory sub-banks in a similar manner. This is repeated for the third batch, the fourth batch, and so on. In this manner, the entire input frame is distributed to the M memory sub-banks.

Here, M values of the output frame spaced QK/M apart are accessed in parallel. Specifically, a "π" block shown in the figure accesses the M memory sub-banks. The block performs the function i=π(j) by employing M individual processes that separately access the M memory sub-banks in a parallel manner, such as in one clock cycle. This requires that the M values of the output frame spaced QK/M apart be located in different ones of the M memory sub-banks. This requirement is referred to here as the tile decoder clash-free constraint.

In other words, the tile decoder clash-free constraint requires that for each $j_1$ and $j_2$ separated by QK/M in the output frame, the memory sub-bank containing $\pi(j_1)$ not equal the memory sub-bank containing $\pi(j_2)$. The index of the memory sub-bank can be expressed as $\lfloor i/(QK/M) \rfloor$. Thus, for each $j_1$ and $j_2$ from the same group of M values in the output frame, the tile decoder clash-free constraint can also be expressed as:

$$\lfloor \pi(j_1)/(QK/M) \rfloor \neq \lfloor \pi(j_2)/(QK/M) \rfloor$$

Thus, both window and tile decoder clash-free constraints are described. According to various embodiments of the present invention, portions of the LDPC parity check matrix H associated with a known code may be column permuted and or row permuted to reduce the number of clashes. The result of such permutation is a new LDPC parity check matrix that represents a new code exhibiting fewer clashes and otherwise having comparable performance. Different techniques for performing such permutation of matrix H in accordance with embodiments of the present invention are discussed below. As discussed previously, the parity check matrix H may be expressed as $H=[H_p|H_d]=[S|JPT]$.

Effect of Permuting P on Clashes
   a. Permuting J Rows of P Matrix

The P matrix is divided into blocks each consisting of J consecutive rows. To permute a block, the J rows within the block are re-ordered in some fashion. Any one or a number of the blocks can be permuted in this manner. This is what is referred to as permuting J rows of the P matrix. Permuting J rows of the P matrix reduces clash in a window decoder.

Generally speaking, permuting J rows of the P matrix can break a clash in a window decoder, but will have little effect on clashes in a tiled decoder. This is because $\lfloor j_1/M \rfloor \neq \lfloor j_2/M \rfloor$ when $\lfloor j_1/J \rfloor = \lfloor j_2/J \rfloor$ if J<M. Note that there is no effect if M is a multiple of J.

b. Permuting Q Columns of P Matrix

The P matrix is divided into blocks each consisting of Q consecutive columns. To permute a block, the Q columns within the block are re-ordered in some fashion. Any one or a number of the blocks can be permuted in this manner. This is what is referred to as permuting Q columns of the P matrix. Permuting Q columns of the P matrix reduces clash in a tiled decoder.

Generally speaking, permuting Q columns of the P matrix can break a clash in a tiled decoder, but will have little effect on clashes in a window decoder. This is because $\pi(j_1) \% M \neq \pi(j_2) \% M$ if $\pi(j_2) = \pi(j_1) + k$ for k=0 to Q−1. Note that there is no effect if M is a multiple of Q.

Thus, tile decoder clashes and window decoder clashes can be independently addressed by utilizing appropriate row and/or column permutations.

Permuting WWise LDPCs to Reduce Clashes
   a. Permuting Columns of H Generally

Columns of the H matrix can be permuted, or re-ordered, to reduce clash. Once an H matrix is found, the columns of the H matrix can be permuted to generate a new matrix H'. The new matrix H' can then be used instead of the original H matrix.

b. Permuting Columns of Matrix Prototypes

According to the present invention, permutation of the columns of the H matrix can performed while adhering to a "structured format" for defining H matrices. The basic principle behind such a structured format is that an H matrix can be defined by specifying a "matrix prototype." A matrix prototype is essentially a condensed matrix that completely defines a corresponding H matrix and can be expanded into the corresponding H matrix. Specifically, each entry of the matrix prototype defines a sub-matrix. All of the sub-matrices generated from the entries can then be combined to form the resulting H matrix.

An example of a structured matrix format is the format presented by the WWise consortium. Generally speaking, this particular structured matrix format expands each entry in the matrix prototype into a square sub-matrix of size Z×Z. The square sub-matrix is one of three possible types: (1) cyclic-permutation matrices, (2) null sub-matrices ("−"), or (3) a subdiagonal matrix ("D"). By expanding each entry into one of these sub-matrices, the entire parity check matrix H can be clearly defined in a "structural" format. A more complete description of this structured matrix format can be found in the WWise proposal. See C. Kose, M. Fischer, et al., "WWise Proposal: Hight throughput extension to the 802.11 Standard," doc.: IEEE 802.11-05/0149r5, July 2005.

For example, the submatrix types (except for the null submatrix) are illustrated below. The structure of parity-check matrices allows a linear-complexity encoder (based on back substitution). In each parity-check matrix, the upper right-hand subblock is the subdiagonal matrix, D, and the rest of the non-null subblocks are cyclic permutation matrices. The cyclic permutation matrix Bi is obtained from the identity matrix by cyclically shifting the rows to the right by i elements. The matrix $B_0$ is the identity matrix. Examples (for a subblock size of 8×8) of cyclic-permutation matrices Bi, as well as the D-matrix which has the subdiagonal structure, are shown here.

$$B_0 = \begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix}, B_1 = \begin{bmatrix} 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \end{bmatrix},$$

$$B_5 = \begin{bmatrix} 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \end{bmatrix} D = \begin{bmatrix} 0 & 0 & 0 & 0 & 0 & 0 & 0 & 0 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{bmatrix}$$

Types of Subblock Matrices

The matrix $B_i$ is produced by cyclically shifting the rows of the identity matrix to the right by i places.

According to one embodiment, the columns of the H matrix can be permuted by simply permuting the columns of a matrix prototype that defines the H matrix. This has the effect of permuting blocks of columns in the H matrix.

c. Cyclically Shifting Columns of Sub-Matrices Generated from Matrix Prototype Entries According to another embodiment, the columns of the H matrix can be permuted by cyclically shifting the columns of a "vertical stack" of sub-matrices within the H matrix. Such a "vertical stack" of sub-matrices is generated from a particular column in the matrix prototype. Further, one or more of such vertical stacks of sub-matrices can be column-wise cyclically shifted in this manner to reduce clashes.

According to various embodiments of the invention, different types of permutations, including (1) permuting J rows of P matrix, (2) permuting Q columns of P matrix, (3) permuting columns of H generally, (4) permuting columns of matrix prototypes, and (5) cyclically shifting columns of sub-matrices generated from matrix prototype entries, can be used alone or in combination to reduce the occurrence of clashes.

Example Code Descriptions

Tables 1 through 3 below depict matrix prototypes that defined select H matrices for various code rates and block sizes. Each of these figures presents a matrix prototype that can be expanded in to an H matrix according to a structured matrix format. The H matrix defined by the matrix prototype in each of these figures is an H matrix whose contents may be row permuted and/or column permuted to reduce clashes in accordance with various embodiments of the present invention.

TABLE 1

Matrix prototypes of parity-check matrices for blocklength N = 1944 bits. Subblock size is Z = 81 bits.

(a) Encoder rate R = ½.

```
 —  —  —  44  —  —  —  66  36  39  52  33   0  —  —  —  —  —  —  —  —  —  —  D
45  —  —  —   —   6  —  —  33  34  44  76   0   0  —  —  —  —  —  —  —  —  —  —
 —  —   0  —  —  10  —  —  61  12   2  62  —   0   0  —  —  —  —  —  —  —  —  —
 —  —  —  —  16   —  —  —  46  25  22  11  46  —  —   0   0  —  —  —  —  —  —  —
 —  26  —  —  —   —  —  —  64  62  72  58  74  —  —  —   0   0  —  —  —  —  —  —
 —  —  —   5  —   —  47  —  71  66  31  18  —  —  —  —   0   0  —  —  —  —  —  —
28  —  —  —  —   —  54  56  80  30  —  37  —  —  —  —  —   0   0  —  —  —  —  —
 —  —  51  —  —  12  —  29  —  50  30  60  —  —  —  —  —  —   0   0  —  —  —  —
 —  —  29  —   3   —  —  55  —  61  67  12  —  —  —  —  —  —  —   0   0  —  —  —
 —  48  —  —  —   —  59   1  53  —  73   5  —  —  —  —  —  —  —  —   0   0  —  —
 —  62  —  63  —   —  —  46   9  78  46  —  —  —  —  —  —  —  —  —  —   0   0  —
30  —  —  —  71   —  —  79  —  67  16  49  —  —  —  —  —  —  —  —  —  —   0   0
```

(b) Encoder rate R = ⅔.

```
69  43  14  33  36  51   0  48  —  36  —  65  —  —  43  —   0  —  —  —  —  —  —  D
41  27  41  23  21  68  —  —   0  —  14  —  70  —  —  21   0   0  —  —  —  —  —  —
20  48  35   9  64  46  —  —  —  61  —  —  —  67  11  —  —   0   0  —  —  —  —  —
76  57   9  41   6  26  55  21  75  —  —  51  —  —  —  45  —  —   0   0  —  —  —  —
14  34  35  48  40  67  —  —  —  80  —  —  72  76  —  —  —  —  —   0   0  —  —  —
46   3  16  23  46   9  59  —  —  —  44   1  —  —  —   0  —  —  —  —   0   0  —  —
11  18  30  17  19   8  —   1  —  —  —  —   2  —  51  —  —  —  —  —  —   0   0  —
39  80   8  56  52  26  —  —  23  —  10  —  —  50  —  —  —  —  —  —  —  —   0   0
```

(c) Encoder rate R = ¾.

```
53  16  71  59  29  51  —  —  10  12  45  44  60  —  —  —   2  —   0  —  —  —  —  D
33  78  29   4  62  55  29  48  15  23  —  —  —  —   5  —  58  —   0   0  —  —  —  —
49  48  47  19   3   3  —  53  —  —  —  70  18  41  —  21  —  61  —   0   0  —  —  —
35  57  48  21  20  27  80  —  63  —  39  42  —   5  40  —  —  —  —  —   0   0  —  —
19  24  36  20  79  49  24  —  —  —   2  —  —  —   9  47  19  46  —  —  —   0   0  —
36  37  56  14   2  40  —  47  —  34  —  —  68  17  —  49  —  22  —  —  —  —   0   0
```

(d) Encoder rate R = ⅚.

```
 0   4  55  12   0  30  11  49   0  51  57  52   0  33  39  60   0  —  19  33   0  —  —  D
60   0   5  35  76   0  55  34   8   0  21  42  21   0  20   5  33   0  29  —   0   0  —  —
48  14   0  46  53  20   0  28  20  37   0   4  77  48   0  67  —  28   0  52  —   0   0  —
22  48  68   0  72  64  75   0  38  70   7   0  59  75  69   0  47  56  —   0  —  —   0   0
```

TABLE 2

Matrix prototypes of parity-check matrices for blocklength N = 1296 bits.
Subblock size is Z = 54 bits.

(a) Encoder rate R = ½.

```
 —  —  —  38  —  —  — 15 13 37 50 22  0  —  —  —  —  —  —  —  —  —  —  D
21  —  —  —  —  14  — 48 30 53 14  0  0  —  —  —  —  —  —  —  —  —  —  —
 — 21  —  —  49  —  — 51 15  6 42  —  0  0  —  —  —  —  —  —  —  —  —  —
 —  —  — 26  —  — 40  3 32 13 10  —  —  0  0  —  —  —  —  —  —  —  —  —
 — 42  —  —  —  — 45 15 35  5 51  —  —  —  0  0  —  —  —  —  —  —  —  —
 —  — 46  —  — 28  — 22 41 42  0  —  —  —  —  0  0  —  —  —  —  —  —  —
43  —  —  —  — 46  0 41  4  — 35  —  —  —  —  —  0  0  —  —  —  —  —  —
 — 32  —  — 32  — 31  — 36 25 26  —  —  —  —  —  —  0  0  —  —  —  —  —
 —  —  5  — 13  — 40  — 43 16 45  —  —  —  —  —  —  —  0  0  —  —  —  —
 — 22  —  —  — 49 49 17  — 17  4  —  —  —  —  —  —  —  —  0  0  —  —  —
 — 34  — 34  —  —  0 51 30 50  —  —  —  —  —  —  —  —  —  —  0  0  —  —
 0  —  —  — 41  — 45  — 34 27  3  —  —  —  —  —  —  —  —  —  —  0  0  0
```

(b) Encoder rate R = ⅔

```
47 25 48 16  6 18 51  —  0 20  —  — 47  —  —  0  0  —  —  —  —  —  —  D
 5 52  7 21 20 16  —  6  —  —  —  —  — 52  —  0  0  —  —  —  —  —  —  —
51 33 13 37 18 40  0  —  —  0  0  —  —  — 11  —  0  0  —  —  —  —  —  —
21 25  4 45 21 11  —  — 32  7  —  —  2 15  —  —  —  0  0  —  —  —  —  —
26 42 12  7 40 53  —  0  — 17 36  — 13  —  —  —  —  —  0  0  —  —  —  —
12 41 32  5 15 35 47  — 13  —  —  — 44 41  —  —  —  —  —  0  0  —  —  —
24 24 30 26 28  4  —  — 36  —  6  —  —  — 45  —  —  —  —  —  0  0  —  —
 6 15 13  3 17 45  — 43  —  — 49  —  — 34 51  —  —  —  —  —  —  0  0  0
```

(c) Encoder rate R = ¾

```
32 20 14  8  2 50  —  — 17  1  5 19 13  —  — 48  —  0  —  —  —  —  —  D
 7  2  2 51 46 41 36 31 26 21  —  —  —  1  — 45  —  0  0  —  —  —  —  —
49 41 37 33 29 25  — 17  —  —  —  1  2 52  — 44  — 36  —  0  0  —  —  —
22 19 16 13 10  0  4  —  3  — 21 48  — 42 39  —  —  —  —  —  0  0  —  —
 2  0 52 50 48 45 44  —  —  — 36  —  —  — 28 26 35 22  —  —  —  0  0  —
29 28 27 26 25 23  — 22  — 20  —  — 17 16  — 14  — 12  —  —  —  —  0  0
```

(d) Encoder rate R = ⅚

```
 0 51 16 25  0 35 43  3  0  5 37 49  0  8  7  8  0  — 21 39  0  —  —  D
28  0 24 35 45  0 20 27 25  0 23 45 20  0 25  5  —  0 32  7  0  0  —  —
41 27  0 30  9 32  0 31 15 42  0  7 44 40  0 28 48  0 48  —  0  0  0  —
19 25 37  0 31 48 50  0 32 23 33  0 26 44 21  0 37 12  —  0  —  —  0  0
```

TABLE 3

Matrix prototypes of parity-check matrices for blocklength N = 648 bits.
Subblock size is Z = 27 bits.

(a) Encoder rate R = ½

```
 —  —  — 10  — 18  —  — 12 21  2 21  0  —  —  —  —  —  —  —  —  —  —  D
 —  — 14  —  —  1  —  —  4 26 22 18  0  0  —  —  —  —  —  —  —  —  —  —
 —  —  —  6  —  —  — 25 11 12  4 22  —  0  0  —  —  —  —  —  —  —  —  —
 —  —  —  —  7  —  — 23 23  9  — 17  —  —  0  0  —  —  —  —  —  —  —  —
 2  5  —  — 19  —  — 13  — 25  1  3  —  —  —  0  0  —  —  —  —  —  —  —
 —  1  —  —  —  —  8  4 13  3  9 14  —  —  —  —  0  0  —  —  —  —  —  —
 —  —  — 11  — 12  — 12  —  — 26 23  —  —  —  —  —  0  0  —  —  —  —  —
24  —  —  —  —  —  —  2  —  6 24  1  —  —  —  —  —  —  0  0  —  —  —  —
15  —  —  —  —  —  7  3 13 17 26  —  —  —  —  —  —  —  —  0  0  —  —  —
 — 16  —  —  —  — 16 14 18  5 18  —  —  —  —  —  —  —  —  —  0  0  —  —
 — 17  —  1  —  — 24 22  0 14 25  —  —  —  —  —  —  —  —  —  —  0  0  —
 —  — 20  —  —  — 21  — 14 20 21  9  —  —  —  —  —  —  —  —  —  —  0  0
```

(b) Encoder rate R = ⅔

```
 — 18  —  —  — 22  5  —  — 20 17 19 24 15  2 20  0  —  —  —  —  —  —  D
 — 22  —  —  8  — 16  —  — 22 13  1 23  8 17 24  0  0  —  —  —  —  —  —
21 11 17  —  —  — 14  — 11  7 15  5 25 21 21  —  0  0  —  —  —  —  —  —
 —  9  —  — 20  — 15  — 26 10 26  9 14 13 14  —  —  0  0  —  —  —  —  —
 —  —  — 20 14  —  —  7 18 16  9  7 23 24 16  —  —  —  0  0  —  —  —  —
20  —  — 12  —  —  —  —  6  0  5  5  2 16 26 13  —  —  —  0  0  —  —  —
 —  — 26  —  — 16  —  6  2  8  8 20 22 17  5 25  —  —  —  —  0  0  —  —
```

TABLE 3-continued

Matrix prototypes of parity-check matrices for blocklength N = 648 bits.
Subblock size is Z = 27 bits.

| 14 | — | — | 26 | — | 13 | — | 26 | — | 6 | 23 | 0 | 4 | 12 | 18 | 2 | — | — | — | — | — | — | 0 | 0 |

(c)
Encoder rate R = ¾

| 13 | 2  | 4  | 0  | 16 | 16 | —  | —  | 11 | 25 | 10 | 11 | 1  | —  | —  | —  | 15 | —  | 0 | —  | —  | — | —  | D |
| 7  | 22 | 0  | 17 | 26 | 1  | 1  | 3  | 20 | 13 | —  | —  | —  | —  | 18 | —  | 13 | —  | 0 | 0  | —  | — | —  | — |
| 19 | 16 | 1  | 15 | 5  | 12 | —  | 5  | —  | —  | —  | 10 | 19 | 12 | —  | 14 | —  | 22 | —  | 0  | 0 | —  | — | — |
| 18 | 13 | 17 | 20 | 6  | 15 | 7  | —  | 13 | —  | 26 | 20 | —  | 25 | 3  | —  | —  | —  | —  | —  | 0 | 0  | — | — |
| 23 | 2  | 13 | 23 | 8  | 3  | 4  | —  | —  | —  | 7  | —  | —  | —  | 17 | 3  | 17 | 5  | —  | —  | — | —  | 0 | 0 | — |
| 5  | 8  | 18 | 22 | 6  | 20 | —  | 5  | —  | 19 | —  | —  | 17 | 16 | —  | 24 | —  | 1  | —  | —  | —  | —  | — | 0 | 0 |

(d)
Encoder rate R = ⅚

| 0  | 22 | 1  | 13 | 0  | 10 | 11 | 1 | 0  | 13 | 5 | 11 | 0  | 17 | 10 | 12 | 0  | 20 | 24 | — | 0 | — | — | D |
| 24 | 0  | 12 | 6  | 2  | 0  | 14 | 5 | 18 | 0  | 21| 7  | 6  | 0  | 8  | 24 | —  | 0  | 18 | 8 | 0 | 0 | — | — |
| 15 | 20 | 0  | 23 | 18 | 4  | 0  | 8 | 2  | 21 | 0 | 17 | 4  | 22 | 0  | 9  | 11 | —  | 0  | 4 | — | 0 | 0 | — |
| 8  | 7  | 11 | 0  | 25 | 2  | 24 | 0 | 23 | 16 | 9 | 0  | 20 | 8  | 5  | 0  | 17 | 17 | —  | 0 | — | — | 0 | 0 |

Given such an H matrix, many possible P matrices can be defined that satisfy the GRA format of H=[S|J*P*T]. In fact, if a particular P matrix is found that satisfies H=[S|J*P*T], a J-rows permutation of the P matrix would also satisfy H=[S|J*P*T]. Similarly, a Q-column permutation of the P matrix would also satisfy H=[S|J*P*T]. According to various embodiments of the invention, the H matrix defined by each of tables 1 through 3 is adopted, and a corresponding P matrix is adopted that is J-rows permuted and/or Q-column permuted to further reduce clashes.

While the present invention has been described in terms of specific embodiments, it should be apparent to those skilled in the art that the scope of the present invention is not limited to the described specific embodiments. The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for performing data encoding comprising:
   receiving a sequence of data bits at an encoder;
   encoding the sequence of data bit according to a code characterized by a parity check matrix (H matrix) to generate a sequence of encoded bits with the encoder;
   wherein the H matrix is capable of being expressed as H=[Hp|Hd]=[S|J*P*T], S being a dual-diagonal matrix, J being a single parity check matrix, P being an interleaver permutation matrix, and T being a repeat block matrix;
   wherein the H matrix is a column permuted version of an original H matrix;
   wherein clashes associated with an interleaver corresponding to the P matrix are reduced by adopting the H matrix instead of the original H matrix; and
   outputting the sequence of encoded bits from the encoder.

2. The method of claim 1 wherein the encoding step is performed using a generalized-repeat-accumulate (GRA) encoder comprising a repetition encoder, an interleaver, a single parity check encoder (SPC), and an accumulator.

3. The method of claim 1 wherein the encoding step is performed using a generalized-repeat-accumulate (GRA) encoder comprising a repetition encoder, an interleaver, an accumulator, and a bit puncture unit.

4. The method of claim 1 wherein the encoding step is performed using a low density parity check (LDPC) encoder.

5. The method of claim 1,
   wherein the original H matrix is capable of being generated from an original base matrix, the original base matrix comprising a plurality of entries, each entry defining a sub-matrix for the original H matrix;
   wherein the H matrix is capable of being generated from a base matrix comprising a plurality of entries, each entry defining a sub-matrix for the H matrix; and
   wherein the base matrix is a column permuted version of the original base matrix.

6. The method of claim 1,
   wherein the H matrix is capable of being generated from a base matrix comprising a plurality of entries, each entry defining a sub-matrix for the H matrix; and
   wherein a vertical stack of sub-matrices defined by a column of entries in the base matrix is cyclically column shifted to generate a corresponding vertical stack of sub-matrices within the H matrix.

7. The method of claim 1,
   wherein the original H matrix is capable of being generated from an original base matrix, the original base matrix comprising a plurality of entries, each entry defining a sub-matrix for the original H matrix;
   wherein the H matrix is capable of being generated from a base matrix comprising a plurality of entries, each entry defining a sub-matrix for the H matrix;
   wherein the base matrix is a column permuted version of the original base matrix; and
   wherein a vertical stack of sub-matrices defined by a column of entries in the base matrix is cyclically column shifted to generate a corresponding vertical stack of sub-matrices within the H matrix.

8. The method of claim 1 wherein the P matrix is a column permuted version of an original P matrix, the original P matrix also conforming to H=[Hp|Hd]=[S|J*P*T].

9. The method of claim 1 wherein the P matrix is a row permuted version of an original P matrix, the original P matrix also conforming to H=[Hp|Hd]=[S|J*P*T].

10. The method of claim 1,
    wherein the original H matrix is capable of being generated from an original base matrix, the original base matrix comprising a plurality of entries, each entry defining a sub-matrix for the original H matrix;

wherein the H matrix is capable of being generated from a base matrix comprising a plurality of entries, each entry defining a sub-matrix for the H matrix;

wherein the base matrix is a column permuted version of the original base matrix; and wherein a vertical stack of sub-matrices defined by a column of entries in the base matrix is cyclically column shifted to generate a corresponding vertical stack of sub-matrices within the H matrix; and wherein the P matrix is a permuted version of an original P matrix, the original P matrix also conforming to H=[Hp|Hd]=[S|J*P*T].

11. A method for performing data decoding comprising:

receiving a sequence of encoded bits at a decoder;

decoding the sequence of encoded bit according to a code characterized by a parity check matrix (H matrix) to generate a sequence of data bits with the decoder;

wherein the H matrix is capable of being expressed as H=[Hp|Hd]=[S|J*P*T], S being a dual-diagonal matrix, J being a single parity check matrix, P being an interleaver permutation matrix, and T being a repeat block matrix;

wherein the H matrix is a column permuted version of an original H matrix;

wherein the decoding step utilizes an interleaver corresponding to the P matrix;

wherein clashes associated with the interleaver are reduced by adopting the H matrix instead of the original H matrix; and outputting the sequence of data bits from the decoder.

12. The method of claim 11, wherein the original H matrix is capable of being generated from an original base matrix, the original base matrix comprising a plurality of entries, each entry defining a sub-matrix for the original H matrix;

wherein the H matrix is capable of being generated from a base matrix comprising a plurality of entries, each entry defining a sub-matrix for the H matrix; and wherein the base matrix is a column permuted version of the original base matrix.

13. The method of claim 11, wherein the H matrix is capable of being generated from a base matrix comprising a plurality of entries, each entry defining a sub-matrix for the H matrix; and wherein a vertical stack of sub-matrices defined by a column of entries in the base matrix is cyclically column shifted to generate a corresponding vertical stack of sub-matrices within the H matrix.

14. The method of claim 11, wherein the original H matrix is capable of being generated from an original base matrix, the original base matrix comprising a plurality of entries, each entry defining a sub-matrix for the original H matrix;

wherein the H matrix is capable of being generated from a base matrix comprising a plurality of entries, each entry defining a sub-matrix for the H matrix;

wherein the base matrix is a column permuted version of the original base matrix; and wherein a vertical stack of sub-matrices defined by a column of entries in the base matrix is cyclically column shifted to generate a corresponding vertical stack of sub-matrices within the H matrix.

15. The method of claim 11 wherein the P matrix is a column permuted version of an original P matrix, the original P matrix also conforming to H=[Hp|Hd]=[S|J*P*T].

16. The method of claim 11 wherein the P matrix is a row permuted version of an original P matrix, the original P matrix also conforming to H=[Hp|Hd]=[S|J*P*T].

17. The method of claim 11 wherein the P matrix is a row permuted and column permuted version of an original P matrix, the original P matrix also conforming to H=[Hp|Hd]=[S|J*P*T].

18. The method of claim 11, wherein the original H matrix is capable of being generated from an original base matrix, the original base matrix comprising a plurality of entries, each entry defining a sub-matrix for the original H matrix;

wherein the H matrix is capable of being generated from a base matrix comprising a plurality of entries, each entry defining a sub-matrix for the H matrix;

wherein the base matrix is a column permuted version of the original base matrix; and wherein a vertical stack of sub-matrices defined by a column of entries in the base matrix is cyclically column shifted to generate a corresponding vertical stack of sub-matrices within the H matrix; and wherein the P matrix is a permuted version of an original P matrix, the original P matrix also conforming to H=[Hp|Hd]=[S|J*P*T].

19. The method of claim 11 wherein the original H matrix corresponds to a defined WWise code.

* * * * *